United States Patent [19]

Soto et al.

[11] Patent Number: 4,870,397
[45] Date of Patent: Sep. 26, 1989

[54] SYSTEM FOR PRODUCING GRAPHIC DISPLAYS AND PROGRAMS FOR GENERATING SAME

[75] Inventors: Jeffrey A. Soto, Medford; Frank A. Pullo, Wantagh, both of N.Y.

[73] Assignee: Grumman Aerospace Corporation, N.Y.

[21] Appl. No.: 928,155

[22] Filed: Nov. 5, 1986

[51] Int. Cl.$^4$ .............................................. G09G 1/16
[52] U.S. Cl. .................................. 340/747; 340/700; 340/789
[58] Field of Search ............... 340/712, 721, 723, 747, 340/700, 789

[56] References Cited

U.S. PATENT DOCUMENTS 4,555,775 11/1985 Pike ...................................... 240/747
4,616,217 10/1986 Nesbitt et al. ........................ 340/747

OTHER PUBLICATIONS

Colorgraphic Aid Program User Guide—Grumman Aerospace Corporation—Mar./24/86—pp. 1-34.

Primary Examiner—Gerald L. Brigance
Assistant Examiner—Mahmoud Fatahi-Yar
Attorney, Agent, or Firm—Scully, Scott, Murphy & Presser

[57] ABSTRACT

A system for producing graphic displays includes a terminal having a display. Input devices such as a graphics tablet provide graphics input data to the system. A multilayered segmented graphics editor edits data supplied to the system. A device independent graphic data base stores edited graphics data of a plurality of symbols appearing on the display. A graphic controller controls the editor and the display. The system includes a program generator for generating corresponding source code programs for graphic displays on independent devices. The programs may be test program sets for automatic test equipment or source codes for computer aided design equipment or printers. The generated source codes may have control structures which permit the display of the independent device to be dynamically altered in response to inputs from the independent device.

15 Claims, 5 Drawing Sheets

Microfiche Appendix Included
(7 Microfiche, 326 Pages)

SYSTEM FOR PRODUCING GRAPHIC DISPLAYS AND PROGRAMS FOR GENERATING SAME

MICROFICHE APPENDIX

Appendix I herein is a computer program listing that is available on microfiche consisting of seven sheets containing 326 frames.

BACKGROUND OF THE INVENTION

This invention relates to systems for producing graphics displays. More particularly, this invention relates to systems for assisting an engineer in producing graphic displays useful in automatic test equipment and for generating test program sets to facilitate generation of the required graphics displays.

The high resolution colorgraphic terminals being supplied with new generation automatic test equipment (ATE) provide an opportunity to significantly improve the quantity and quality of the information the ATE station operator receives This becomes important with the increasing complexity of the Units Under Test (UUT) and the ATE equipment designed to test them. Densely populated component boards create the potential for incorrect circuit or pin identification. Detailed graphics can help operators locate components and provide important information or warnings immediately, so the operator does not have to stop and consult hard copy documentation. Intelligently produced graphics reduce the chance of operator error and speeds the entire testing process. This information may consist of self test displays, interconnection diagrams, adjustment displays and board layouts and should guide the operator through each step of the test procedure. Test programs that do not require much intervention from the operator may not require extensive graphics; however, all test programs require the operator to power up the station and connect interface devices and can benefit from online instructions and diagrams.

Although substantial graphics capability is being provided with some ATE stations, operator displays tend to be simplistic and do not fully utilize the graphics system. This is due to the difficulty involved in programming a sophisticated graphics display. Generating ATE displays manually requires a laborious and time consuming programming effort with even relatively simple displays taking weeks to program and debug. Graphics programming is essentially trial and error and it is difficult to predict how a display will appear until it is run on station. The need to code the intricate graphics portions of the test program and the need to verify these portions by compiling, testing and modifying lengthens integration time, increases the burden on the test programmer and distracts him from his primary task of analyzing the UUT and developing a testing strategy. This drives up test program set (TPS) production costs.

In an Automatic Test Language For All Systems (ATLAS) test program that includes probing illustrations and detailed UUT hook up information, up to 25% of the program may be devoted to the drawing and control of graphic displays. Graphics programs are highly "device dependent;" i.e., displays created for one type of terminal usually will not operate on another. This presents a problem in terms of test program compatibility and portability. These problems also drive up the cost of producing test program sets and lead to a limited use of colorgraphics.

In order to control costs, test programmers rely on "canned" routines. These are generated routines that only indicate the current test status. If more detailed instruction graphics are required they are then referenced in the available printed materials. This requires the operator to stop, locate, and read the appropriate manual before he can continue It is desirable to provide as much online instructional material as possible but a completely interactive set of instructions graphics has been too costly to produce. These factors lead to an under-utilization of the available graphic display system and an ineffective user interface.

In manual display preparation, generally, after the test strategy is defined and the required operator actions known, the engineer can begin creating the interface for the program. He begins by first planning the displays or diagram sequence on sheets of graph paper with the screen coordinates marked on the paper. Everything that appears on the screen must be built out of the basic graphic primitives such as vectors, circles, rectangles, polygons, text, etc. Using the ATLAS graphic extensions each display layout is coded into a subprogram. The following statements are typical of the graphic extension statements provided by RADCOM and CA-TIII-D ATLAS dialects;

012345 DRAW, RECTANGLE BOUNDED BY
        p1, p2 AND p3, p4
        AT p1, p2 OF LENGTH n1, n2 $
    012345 DRAW, CIRCLE AT p1, p2
        OF RADIUS n $
    012345 DRAW, IMAGE AT p1, p2
        USING n ELEMENTS FROM
        'list' (index) $ The manually generated display is combined with other displays to form a sequence. Component identification displays require figure positional maps and other data and control structures. The display programs are integrated with the main test program and then tested on the ATE station, modified, and tested again until all the displays perform as expected. A great deal of time and effort is spent in translating the visual layout into an executable form. The goal of any automated system is to eliminate graphics coding by the TPS engineer and to provide a means for testing display programs without tying up ATE resources.

It is also desirable for a graphics display program to support multilayered graphics; that is for the user to be able to arbitrarily display a symbol in a different manner to provide additional information to the user of the automatic test system. Generally, program test sets supporting such multilayered displays are even more complex and costly to write, test and verify than single level displays.

BRIEF SUMMARY OF THE INVENTION

It is a principal object of the invention to provide a system which rapidly and efficiently produces graphic displays.

It is another object of the invention to provide a system which produces test program sets for generating such displays for automatic test equipment.

It is a further object of the invention to provide a system which produces test program sets supporting multilayered displays.

It is yet another object of the invention to provide an apparatus having a device independent graphic data base which can be expanded by the user.

It is still another object of the invention to provide a system which includes means for simulating an automatic test system terminal.

It is an additional object of the invention to provide a system wherein the graphic display may be dynamically altered by the simulator of the automatic test system terminal.

It is yet another object of the invention to provide a system which produces source code programs for independent devices including graphics displays which include a control structure permitting the graphics displayed by the independent device to be altered in accordance with inputs from said independent device.

In accordance with the invention a system for producing graphic displays includes a terminal having a display. Input means provide graphics input data to the system. A multilayered segmented graphics editor edits data supplied to the system. A device independent graphic data base stores edited graphics data of a plurality of symbols appearing on the display. A graphic controller controls the editor and the display.

The editor includes first control means for controlling the graphics data and second control means for directing control of the the display. The first and second control means are separate and independent components of the editor.

The graphics editor includes a symbol editing means for editing the symbols and a placement editing means for editing the position of the symbols on the display.

These editing means include functions accessed by a dispatcher. The functions have access to the dispatcher so that the functions can access other of said functions through the dispatcher.

The system according to the invention also includes a program generator for generating a source code program for an independent device from data produced by the editor. The generator may produce a program which includes control structures embedded in the data so that at least a portion of the graphics displayed on the independent device may be conditionally executed in accordance with inputs from the independent device.

The multilayered segmented graphics editor may be used to build the display out of successively layered components that are keyed and indexed. The layers are assigned meanings by the user. Layers may be used to change the color of a symbol, highlight different parts thereof, provide a more detailed representation of a symbol, represent design hierarchies, or may be textual information relating to the symbol.

BRIEF DESCRIPTION OF THE DRAWINGS

In order that the invention may be readily carried into effect, it will now be described with reference to the accompanying drawings, where.

DETAILED DESCRIPTION OF THE PREFERRED EMBODIMENT

Figure 1:
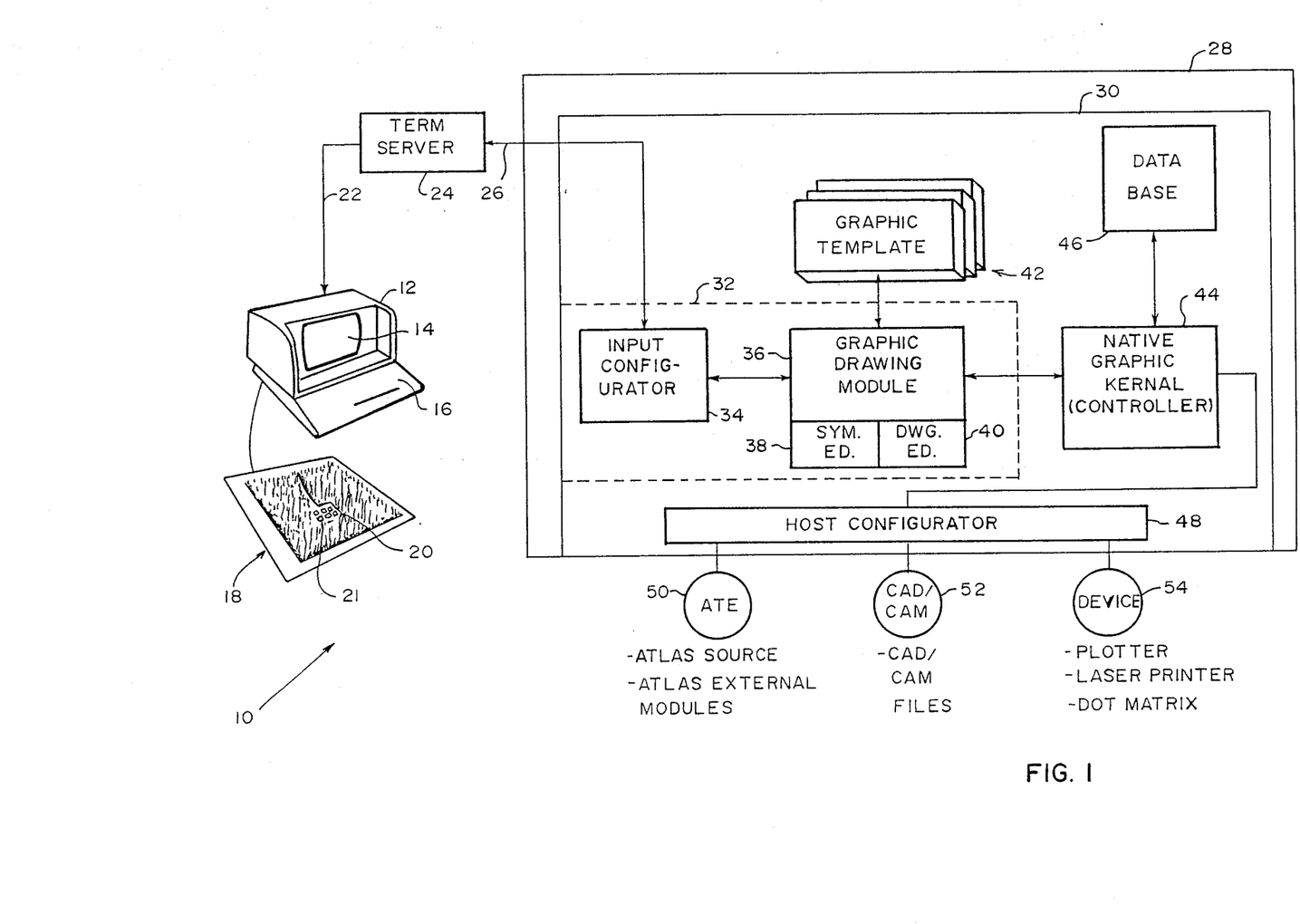
FIG. 1 is a block diagram of the apparatus according to the invention.

Referring to FIG. 1, the system 10 according to the invention includes a graphics display terminal 12 such as an Envision/Lear-Siegler terminal. Terminal 12, which has a graphics display screen 14 and a keyboard 16 is connected to a graphics tablet 18 including a controller 20 having a keypad 21, which permit the user to input graphics data to terminal 12. Terminal 12 is connected by an RS-232 bidirectional data bus 22 to a terminal server 24 which is in turn connected to an Eithernet cable 26. Cable 26 is in turn connected to a computer 28.

Computer 28 is preferably one of the Digital Equipment Corporation VAX/VMS family of computers. Computer 28 thus has all the usual attributes of a computer including an operating system, data storage including RAM and a disc drive and a central processing unit (not shown).

According to the invention computer 28 is programmed with a series of routines and subroutines which together form a software package 30. While a source code listing for package 30, written in Extended Pascal, is set forth in the APPENDIX I, a general description of the software and its operation in system 10 is given. In addition a User Guide to the software is provided and entitled "Colorgraphic Aid Program" (copyright Grumman Aerospace Corporation) incorporated herein by reference.

Software package 30 includes a graphics editor 32 which is comprised of an input configurator 34, and a graphic drawing module 36.

Input configurator 34 serves to tailor the display that appears on screen 14 of terminal 12 so that it is representative of what the user of a device for which system 10 generates a program would see on that device. In other words the capabilities of the device for which a graphic program is being generated, in terms of color selection (or black and white for a laser graphics printer), screen resolution, primitives that may be selected and the aspect ratio of the screen (or of the image created if the device is a printer) are represented. Thus, input configurator 34, a part of editor 32, sets up parameters which serve to adjust the editor for this purpose.

Graphic drawing module 36 includes two sub-editors (referred to herein as editors); a symbol editor 38 and a drawing editor 40. Symbol editor 38 is used to construct symbols. Drawing editor 40 is used to place the symbols in their respective translational positions. Using this approach provides a basic capability for manipulating the low level primitives of lines, color, etc. which are drawn without respect to position on a drawing in a device independent coordinate field, i.e., the nature of these symbols will be independent of the device for which the graphics programs or test program set is prepared. The symbols can be drawn to any size or scale.

Graphic drawing module 36 has access to graphic templates 42 which are drawing aids such as placement grids and snap grids which are useful in producing the drawings during the actual mechanics of inputting the data. The graphic templates also provide the ability to call out previously drawn symbols and use those as references for drawing. For example, a particular type of drawing background may be stored as a symbol and later called for use, for example, as a reference border. This generalized concept of the use of a symbol as a reference border is particularly well suited for producing a combination of multileveled drawings. It permits components of the drawings to be used for reference so that each individual isolated component is not drawn without regard to the rest of the drawing. These references can be loaded into the editor for such reference use from graphics templates 42 without becoming part of the editable data; i.e., the actual drawing being produced.

The graphic drawing module 36 interacts with a native graphic kernal or controller 44 which contains the underlying routines which permit the user to manipulate the graphic primitives available to graphic drawing module 36 from input configurator 34. The routines are of a low level and are used, for example, to assign color, for drawing a line, doing numerical calculations, doing transformations, etc. The routines are generic (i.e., device independent). Although shown as a separate functional block, controller 44 in fact represents software that underlies editor 32.

The operation of input configurator 34, symbol editor 38 and drawing editor 40 is controlled with remote procedure calls, rather than directly, thus allowing a structural division of the program so that native graphic kernal or controller 44 can be altered or different graphic devices used with editor 32 without having to restructure the program. In other words, the editors are isolated from or independent of the devices for which data is being edited.

Controller 44 maintains the edited data produced by editor 32 in data base 46. This data is supplied by controller 44 to a host configurator 48, which access data base 46, extracts the relevant data of the drawings being produced and generates device specific source code for various devices. For example, ATLAS graphics extension source code is generated for ATE stations 50. This code may be for a multilevel drawing. Appropriate source code is generated for CAD/CAM devices 52. Source code for generating single level drawing, such as those produced by a laser printer 54 having proprietary control codes may also be generated. The host configurator portion of the software package 30 (listed in APPENDIX I) is appropriate for generating source code for an ATE terminal of the type disclosed in U.S. Pat. No. 4,342,029 to Hofmanis et al. assigned to the assignee of the present application or an Envision/Lear Siegler terminal. It can also generate source code for ATE devices such as the RADCOM/CAT-IIID. Source code for laser printers such as, for example, a QMS printer can also be generated. For details of the features supported for these devices reference is made to pages 6 and 7 of the Colorgraphic Aid Program User Guide.

Host configurator 48 may be expanded in conjunction with input configurator 32 to generate appropriate graphic display source code for other devices. All such source code is generated from the same data base, as editor 32 is a generalized editor which has a configuration which may be adjusted based on inputs from input configurator 32 and host configurator 48.

Figure 2:
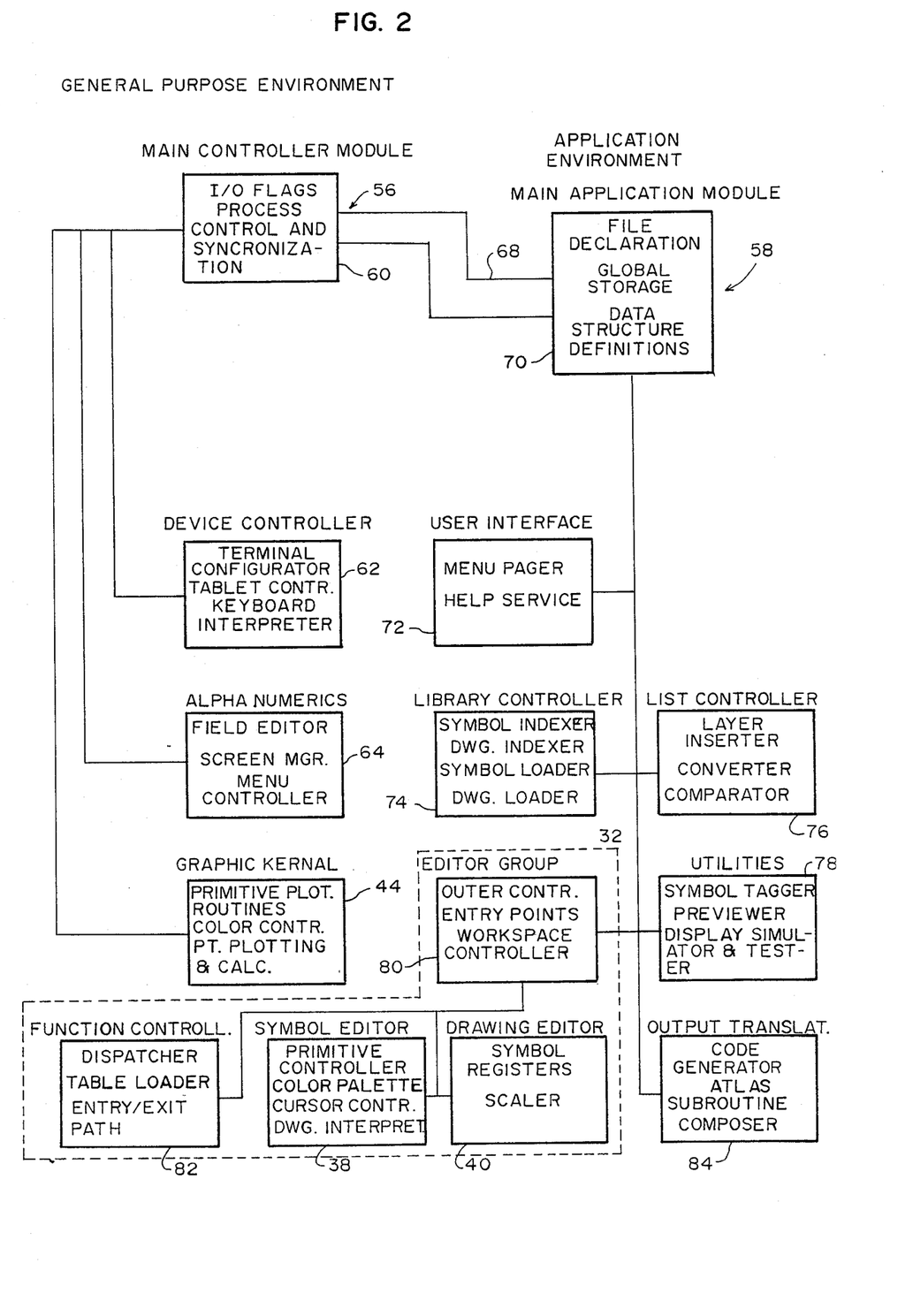
FIG. 2 is a more detailed block diagram showing the interconnection of various system modules of the system of FIG. 1.

Referring to FIG. 2, software package 30 is divided into two major portions; the general purpose environment 56 and the application environment 58. The general purpose environment includes a main controller module 60 and its support routines which support generic capabilities that most programs require and therefore supports the application environment. It provides for many functions not directly connected to the programming language. It consists of high level routines, such as, those described below.

Main controller module 60 contains the input/output (I/O) flags which are system level flags in the program which direct what I/O devices will interact with software package 30. The terminal is capable of various types of I/O functions including physical I/O which is unbuffered and unstructured, or structural block I/O using basic communication routines.

Main controller module 60 also provides process control and synchronization including the ability to create subprocesses of the main process and the ability to control and communicate with these sub-processes. Also available are interprocess communication and mailbox I/O functions, and the ability to associate these functions with common event flags.

Device controller 62, a support routine for main controller module 60, includes a terminal configurator for establishing parameters for terminal 12. A tablet controller defines the function of tablet keypad 21. A keyboard interpreter marks off characters from the keyboard without providing an echo or requiring carriage return commands from the keyboard.

Alphanumerics module 64 is a general purpose routine which includes a field (input) editor, which permits the user to type in entries which are to appear on the display screen, such as letters, colors, and graphic characters with more control than is provided by the programming language. Module 64 also includes a screen manager and a menu controller. Module 64 is terminal independent, using TERMCAPS. Once the terminal has been identified, output codes will be adjusted for that particular terminal, provided that terminal is "known" to the system.

The graphic kernal 44, as noted above, provides a general purpose capability for control and manipulation of the graphic primitives. It includes primitive plotting routines, and a color controller for assigning and mixing colors, by using more than one color number to specify a color to be plotted. A point plotter provides the ability to point and to manipulate points, to perform numerical calculations for purposes of, for example, scale transformation and to read digitization values from the device control.

The general purpose environment 56 is environmentally linked to the application environment 58 so that any routine in the application module can access any routine in the general purpose environment. This is accomplished by a high level link 68 between main controller module 60 in general purpose environment 56 and main application module 70 of the application environment. Specifically, this is accomplished due to the file declaration, global storage, data structure and definition functions provided by main application module 70.

In terms of the editor, a user interface 72 includes routines for interfacing with the user at terminal 12 such as a menu pager and help service. The menus and data files are processed by an interpreter to provide the appropriate codes for driving the screen. The help service routines exist as ASCII text which must be accessed.

A library controller 74 provides access to and from the disc data storage system used by computer 28. It acts as a formatting interface between the data in a form that can be operated upon internally and a form that can be stored. Controller 74 also controls the linking of different data lists as these lists describe one another. Controller 74 includes a symbol indexer, a drawing indexer, a symbol loader, and a drawing loader, thus assuring separation of the symbol and drawing lists. It is those routines capable of loading and storing symbols and drawings into dynamic lists that are used for editing.

List controller 76 is a lower level controller which manipulates the lists in term of controls from the editor, i.e., once the editor is entered to create or modify a symbol, list controller 76 access that list for the editor in the overall symbol library and loads that section of the list into the editor for manipulation and then puts it back into a structure which may be stored. While library controller 74 handles symbol data on a unit basis, list controller 76 handles such data on a list basis, operating on a symbol as a unit.

A utilities module 78 includes a symbol tagger, previewer, display simulator and tester which are all utilities for manipulating the drawing after it has been created. These utilities provide certain features of the drawing data that are needed for translation to a test program set, such as user defined tags. Each symbol, after being placed on the screen, can be given a user defined tag so that it can be referenced by the user after translation. These utilities provide a way for the test programs of the automatic test equipment to communicate with the already created subroutines. This is done by passing the user defined tags. The test programmed is freed from the need of knowing how the program is structured, how the graphics are implemented or what screen addresses (the location of the item on the screen) are used. The programmer merely needs to know the tag given to the item of interest to find that item.

The editor 32 includes an editor group 80 which includes an outer controller, an entry point definer and a workspace controller. These routines permit manipulation of the graphic data by, for example, expanding a drawing, scaling a drawing, depositing or deleting primitives or compacting a list.

Many of the routines of editor group 80, such as those responsible for the ability to manipulate the workspace, scaling capability, reference boarders and menu pager, which allow manipulation of graphic data, are shared with symbol editor 38 and drawing editor 40. There is a degree of overlap, as some routines are shared and others are not shared.

Symbol editor 38 includes primitive controller, color palette, cursor control and drawing interaction routines. Drawing editor 40 includes symbol registers and a drawing scaler. The functions provided by the routines of symbol editor 38 and drawing editor 40 allow the user to highlight and delete, to expand a line, to report the cursor as a point is digitized, to draw a figure at the point reported by the cursor, to verify that a drawing entry is correct, to delete the entry if it is not correct, and to deposit data to the data lists.

A function controller 82 preforms the mapping of individual mapping functions to their key positions in the editor. The program does not include "hard coded" functions. Each individual function is an isolated, single function which can be deposited anywhere in the program. Function controller 82 includes a recursive dispatcher; that is, a dispatcher that can call itself, as more fully described below (FIG. 3), a table loader and entry and exit trees.

In software package 30, all the functions that actually manipulate data, and all the functions which manipulate what is displayed on screen 14 of terminal 12 are separated so that what is seen on screen 14 is controlled by one set of routines, while the underlying, "behind the screen" data manipulation is controlled by another set of routines. This permits flexibility in making changes in and maintenance of software package 32. For example, highlighting routines can be changed without changing the manner in which the underlying data is manipulated. Alternatively, the data structure may be changed without changing the display provided to the user of terminal 12. The editor is divided into several nested states, i.e., when a menu is accessed, that brings into play an entire range of other functions (typically 12 functions, each one being assigned to one of 12 keys on a telephone style keypad, i.e., keypad 21).

Output translator 84 accesses the device independent data base and uses that data to create device specific code, such as, for example, ATLAS source code. The source code is then loaded on to a disc which is transferred to the disk drive of, for example, the ATE, where it is compiled along with other programs used in the ATE. Transfer of the ASCII code produced with a direct electrical interface is also possible. This may be accomplished using any bus type communications protocols such as, for example, X.25.

Figure 3:
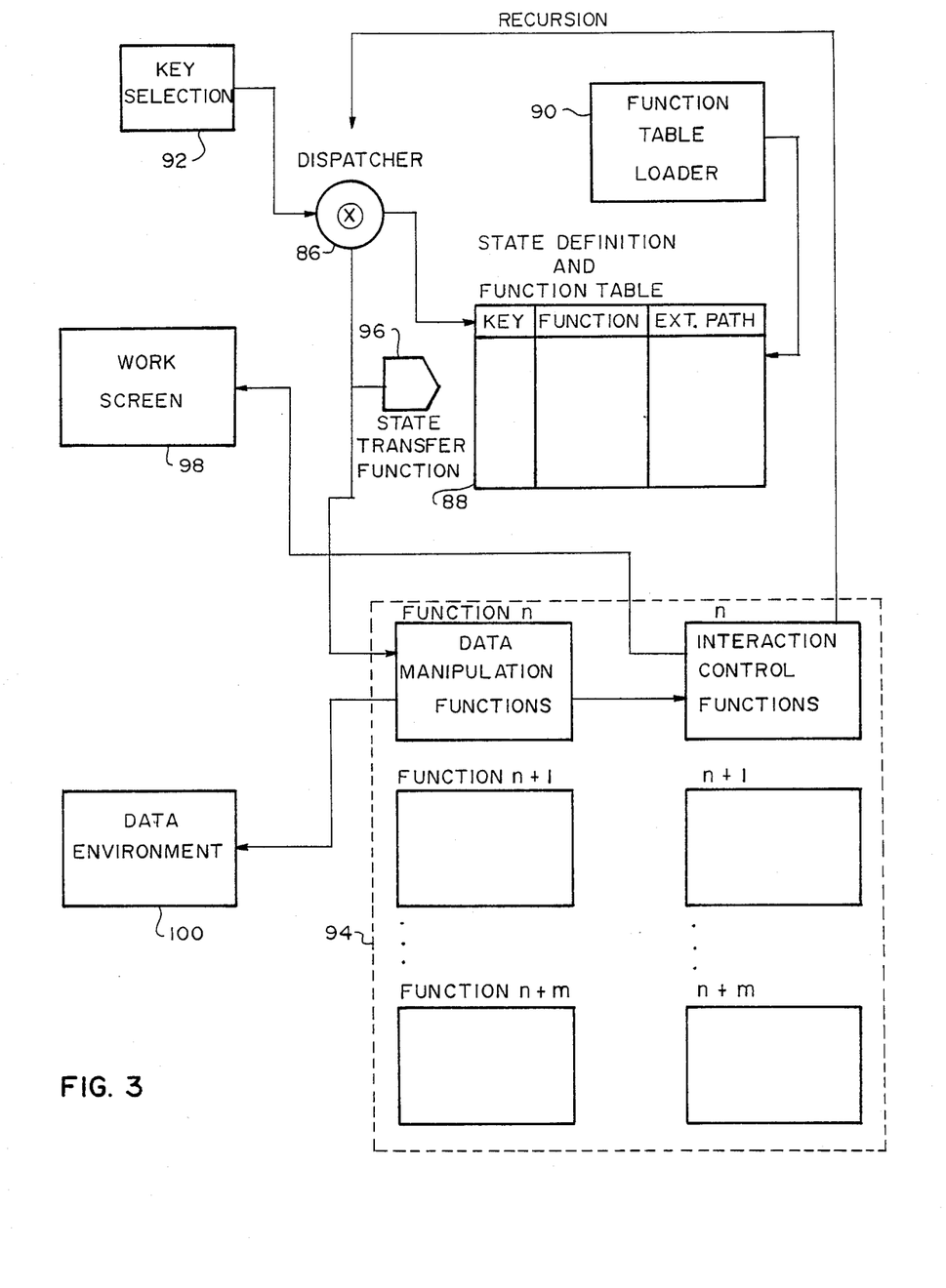
FIG. 3 is a control flow diagram of the editor control structure of the editor of FIG. 1.

Referring to FIG. 3, the editor control structure is of a generalized nature so that routines can be added or changed in the editor without having to change the control structure which manipulates these routines. A dispatcher 86 accesses a state definition and function table 88 loaded by a function table loader 90. Table 88 lists which functions are in what section, of the editor and the order in which they are called (i.e., with which keys are the functions associated). The editor is configured as necessary simply by calling in a different function table. There are separate function tables for symbol editor 38 and display editor 40 which may be varied as specified by input configurator 34 (FIG. 1).

When a key selection is made, a key selection function 92 allows the editor to access the function called from among function group 94 which includes data manipulation functions and interaction control functions.

State transfer function 96 acts as a memory for the path by which nesting into the function table has occurred so that the location in the editor is recorded and the path out of the editor is known.

As noted above, the functions service two entities, the work screen 98, and the data environment 100, which includes the actual lists that are manipulated.

When a key selection is made in the editor, such as, for example, when the user presses a key to make a digitization, dispatcher 86 determines from the function table 88 what that key calls for. Dispatcher 86 then checks state transfer function 96 to determine what state the editor is in; that is whether work screen functions or data environment functions are accessed. At this point the function in function group 94 that is required has been determined, and is available for use.

The functions in function group 94 have the capability of returning to dispatcher 86 to call out other functions. This is the manner in which the recursive nature of the editor is implemented.

Figures 4, 6:
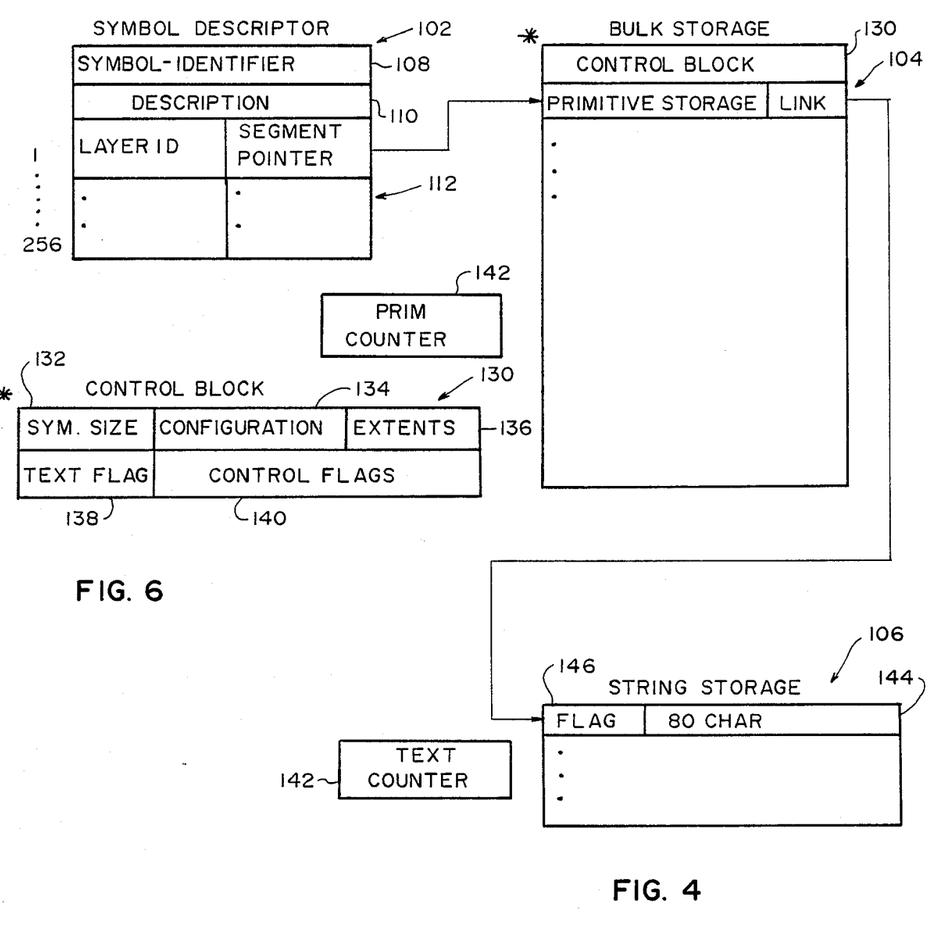
FIG. 4 is a diagram of the symbol data structure utilized by the system of FIG. 1.
FIG. 6 is a detailed diagram of the control block of a primitive storage cell used, respectively, in the symbol data structure and drawing data structure of FIG. 4 and FIG. 7.

The symbol data structure is illustrated in FIG. 4. It includes a symbol descriptor 102, bulk storage 104 and string storage 106, stored separately from the actual graphic data because character string arrays are required.

Symbol descriptor 102 provides the symbol identifies, that is the identifier that the symbol has in the library. An eighty character description field 110 also provides information as to the nature of the symbol or its use or application. Layer arrays 112 include a layer identifier which is user defined and a segment pointer which is a numerical pointer specifying where the primitives that make up the layer being pointed to are located in bulk storage 104.

Figure 5:
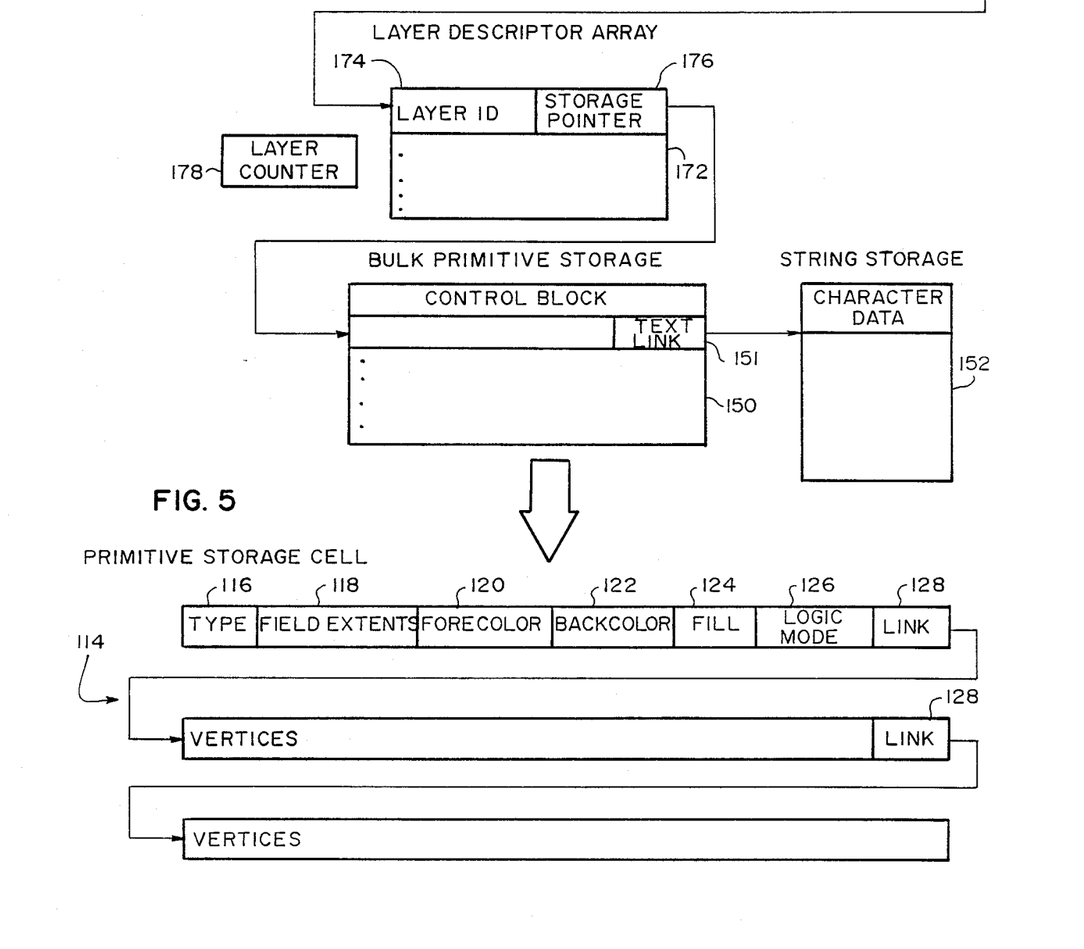
FIG. 5 is a diagram of the structure of a primitive storage cell used, respectively, in the symbol data structure and drawing data structure of FIG. 4 and FIG. 7.

Referring to FIG. 5, a primitive storage cell 114 has a type definition 116. A field extents 118 provides the length of the primitive (i.e., where it begins and where it ends on the screen). A foreground color is defined at 120, while a background color is defined at 122. A fill pattern code 124 defines whether a fill pattern is implemented on the symbol. These codes are generally pointers to a list of patterns. A logic mode code 126 defines how the symbol is displayed in terms of the different control modes of the terminals which are represented, such as additive or replacement modes (i.e., will one color completely overlap the other, or will the bit field mix). If a link 128 has an enable code therein, then there is more information to follow and the next cell will be read, that is the next of the verticies of the primitive. For example, a line has two verticies, while a square has four, and a polygon has a number of vertices equal to the number of sides thereof.

Character data has a slightly different structure in that the link is used to string bulk storage. This provides the actual characters to be displayed.

Referring to FIG. 6, a control block 130 is the first reserved space in the primitive storage cell. The control block 130, at 132, defines the symbol size for the entire symbol, and defines the configuration, at 134, for detailed implementation and placement in the drawing field. The extents of the symbol, at 136, defines the extent of the entire symbol; that is the dimensions in open area. Text flag 138 is used to signal whether there are any character strings. General purpose control flags 140 are available for special purposes to be assigned as needed.

Referring again to FIG. 4, a primitive counter 142 keeps track of where the next bulk storage space is available, so that as a drawing is being edited, new symbols can be properly placed. This is the manner in which layering of symbols is actually implemented. All the primitives are compacted into a list, and there are pointers which provide the actual divisions between layers. Each layer, or division, is editable by itself. The display list controllers, discussed above with respect to FIG. 2, perform the actual insertion and deletion of primitives in the lists. Thus, an entire layer of primitives can be removed from the symbol, edited, expanded if necessary, and then reinserted in bulk storage. The list controller then appropriately coordinates all the pointers. In the preferred embodiment of the invention, up to 256 layers can be implemented for each symbol.

String storage 106 is based on an algorithm that uses the principle that the next available space is easiest to find. A text counter 142 specifies the next available position for storage as character strings are entered. If a character is deleted, no attempt is made to compact the data, which is a time consuming process. Instead all the character cells 144 are sequentially used. However, each character cell 144 has a flag 146 which provides an indication as to whether a character cell is occupied. It is only when the entire character list space is exhausted, that is the pointer has reached the end of the list, that the algorithm goes back to look for open character cells. Thus, it is possible that the characters will be placed in the character list in an order which is not necessarily sequential. However, if the space is sufficiently large, this will rarely happen. The storage area is not actually compacted until the list is stored. This type of algorithm requires less space than a so-called "pure hashing" algorithm.

Figure 7:
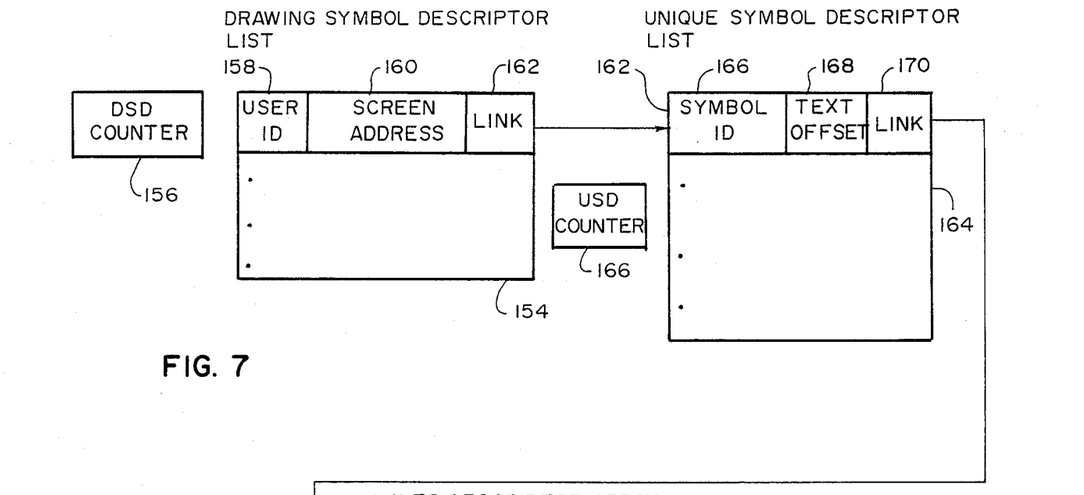
FIG. 7 is a diagram of the drawing data structure utilized by the systems of FIG. 1.

The drawing data structure is illustrated in FIG. 7. This data structure compactly stores the lists of symbols of the type defined by FIG. 4, just as the primitives are stored in just one area of bulk storage. A bulk primitive storage area 150 and a string storage area 152, linked by a text link 151, are defined. Pointers or descriptors are then used to define which primitives belong to the symbols and which layers of the drawings. This is done by using several functional blocks including a drawing symbol descriptor list 154 and a descriptor counter 156. Drawing symbol descriptor list 154 contains the user defined identifiers 158 (one of the tags discussed above). Often a particular symbol appears many times in the drawing under different user identifiers. For example, a resistor symbol may appear many times on a circuit board. However, the symbol will appear only once in the data. Thus, this symbol will appear under several different user identifiers, each having a different screen address 160 but linked to just one symbol identifier, in a unique symbol descriptor list 164 by a link 162 (for each user identifier). The unique symbol descriptor list has a separate entry only for each unique symbol, regardless of how many times the symbol is duplicated on the screen. Thus, all the data and primitives associated with that symbol are entered only once.

A unique symbol descriptor counter 166 determines the next available position in the unique symbol descriptor list for a unique symbol. An entry is made only when a unique symbol not already on the screen is created. The unique symbol descriptor list includes for each symbol, the unique symbol identifier 166, that is the identifier that the symbol is known by in the system, rather than the user defined identifier. Also included is the text offset 168 which provides the position in string 152 where additional character strings can be stored. A link 170 to a layer descriptor array 172 is also provided.

Layer descriptor array 172 defines which layers of the bulk storage list of bulk primitive storage 152 belong to particular symbols. A layer identifier 174 and a storage pointer 176 are provided for each layer defined for each symbol. Storage pointer 176 defines where in bulk primitive storage 150, the layer begins. A layer counter 178 is provided for the layer descriptor array.

Only the actual primitives, the symbol descriptors and the layer descriptors take up storage space. This results in a very compact data structure for relatively complex screens, since generally symbols are duplicated, and it is only another pointer that is added. This permits the creation of extremely compact subroutines when the translation to a host language is made by host configurator 48, since the data is already organized and merely needs to be translated to a form which can be compiled and executed by the external system, such as, for example, the ATE. This is accomplished by the program GATRANS in the listing of APPENDIX 1. GATRANS takes the data statements in bulk primitive storage 150 and composes data fill statements for the ATLAS or other routine produced.

The source code produced includes graphics data and embedded control structures such as the user tags discussed above, and level identifiers for various levels of the multilevel data structure. As a result, the graphics displayed on, for example, ATE can be dynamically altered in response to inputs from the ATE system which, for example, highlight a particular symbol or access a level associated with that symbol.

APPENDIX 1 includes a modules/procedure cross reference to assist in understanding the operation of software package 32 in terms of the description set forth above.

The program may be made self documenting by including for each screen display function corresponding help function text accessible for screen display to assist the user of the system.

A though shown and described in what is believed to be the most practical and preferred embodiment, it is apparent that departures from the specific method and designs described and shown will suggest themselves to those skilled in the art and may be made without departing from the spirit and scope of the invention, We, therefore, do not wish to restrict ourselves to the particular construction described and illustrated, but desire to avail ourselves of all modifications that may fall within the scope of the appended claims.

We claim:

1. A system for producing graphic displays independent of any output graphics device comprising:
   (a) a terminal including a display;
   (b) input means for providing graphics input data to said system, said data appearing as a plurality of symbols on said terminal display; and
   (c) a graphic display generating means for receiving the graphics data and producing a graphic display, said graphic display generating means comprising:
      a multilayer segmented graphics editor for editing the graphics data generated by said system, said editor including first segment control means for controlling the format of said graphics data generated on said system to match a selected one of several preselected output graphics devices and second segment control means for controlling said graphics data generated by said system independent of any output graphics device;
      a device independent graphic data base for storing edited graphics data independent of any output graphics device;
      a graphic controller for controlling said editor and said display independent of any output graphics device; and
   (d) program generator means for generating a source code program for said selected output graphics device from data generated by said system.

2. The system of claim 1, wherein said second control means comprises:
   a symbol editing means for constructing and editing said symbols generated by said system independent of any output graphics device; and
   a placement editing means for positioning and editing the position of said symbols generated by said system to match said selected output graphics device.

3. The system of claim 1, wherein said graphics editor includes:
   a recursive dispatcher for accessing a plurality of editing functions.

4. The system of claim 1, wherein said graphics editor includes a simulation means for simulating the display characteristics of said selected output graphics device.

5. The system of claim 4, wherein said preselected output graphics devices are of an automatic test equipment display terminal, a printer and a computer aided design display terminal.

6. The system of claim 4, wherein said graphics editor includes a display manipulating means for altering the display on said terminal in response to inputs provided by said simulation means.

7. The system of claim 1, wherein said generator means includes means for generating a source code program including control structures embedded in said graphics data so that at least portions of the graphics displayed on said selected output graphics device may be executed in accordance with inputs from said selected output graphics device.

8. The system of claim 1, wherein said source code program is a test program set for automatic test equipment.

9. The system of claim 1, wherein said input means comprises a graphics input tablet.

10. The system of claim 1 wherein said first control means include means for manipulating said graphics data in one or more coordinate fields independent of a selected output graphics device.

11. The system of claim 1 wherein said first control means include means for selecting the format of said generated graphics data to match a selected output graphics device.

12. The system of claim 2 further including means for providing graphic templates on said display together with said generated graphics data.

13. The system of claim 1 wherein said editor includes means for placing symbols in one or more data storage layers.

14. The system of claim 6 wherein said display manipulating means include means for tagging symbols on said display prior to generation of said source code program.

15. The system of claim 6, wherein said simulation means include means for simulating inputs from said selected output graphics device.

* * * * *